(12) United States Patent
Kumazawa et al.

(10) Patent No.: US 7,804,238 B2
(45) Date of Patent: Sep. 28, 2010

(54) FUNCTIONAL THIN-FILM ELEMENT, PRODUCING METHOD THEREOF, AND ARTICLE USING FUNCTIONAL THIN-FILM ELEMENT

(75) Inventors: Kinya Kumazawa, Yokosuka (JP); Mamoru Sayashi, Kitami (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 1182 days.

(21) Appl. No.: 11/211,079

(22) Filed: Aug. 25, 2005

(65) Prior Publication Data

US 2006/0046082 A1  Mar. 2, 2006

(30) Foreign Application Priority Data

Aug. 31, 2004 (JP) ............................. 2004-253226
Aug. 31, 2004 (JP) ............................. 2004-253239

(51) Int. Cl.
*H01J 1/62* (2006.01)
(52) U.S. Cl. ........................ 313/503; 313/506
(58) Field of Classification Search ................ 313/503, 313/506
See application file for complete search history.

(56) References Cited

U.S. PATENT DOCUMENTS

| | | | | |
|---|---|---|---|---|
| 5,965,281 A * | 10/1999 | Cao | ............................ | 428/690 |
| 6,420,057 B1 * | 7/2002 | Ueda et al. | ................... | 428/690 |
| 7,311,858 B2 * | 12/2007 | Wang et al. | ............ | 252/301.4 F |
| 7,494,903 B2 * | 2/2009 | Kahen | ......................... | 438/499 |
| 2002/0037432 A1 * | 3/2002 | Park et al. | ..................... | 428/690 |
| 2004/0245912 A1 * | 12/2004 | Thurk et al. | ................. | 313/484 |
| 2006/0052509 A1 * | 3/2006 | Saitoh | ...................... | 428/297.4 |
| 2008/0182391 A1 * | 7/2008 | Kahen | ......................... | 438/479 |
| 2009/0134414 A1 * | 5/2009 | Li et al. | ......................... | 257/98 |

FOREIGN PATENT DOCUMENTS

| | | |
|---|---|---|
| JP | 6-188074 A | 7/1994 |
| JP | 11-251066 A | 9/1999 |
| JP | 2002-141173 A | 5/2002 |
| JP | 2003-40873 A | 2/2003 |
| JP | 2003-308984 A | 10/2003 |
| JP | 2003-332075 A | 11/2003 |
| JP | 2004-63210 A | 2/2004 |

OTHER PUBLICATIONS

Organic Element Technique, Technotimes Publication Co., Ltd., Dec. 20, 2001, pp. 16-17.

* cited by examiner

*Primary Examiner*—Peter Macchiarolo
(74) *Attorney, Agent, or Firm*—Foley & Lardner LLP

(57) ABSTRACT

A functional thin-film element comprises: a substrate (2); an anode (3) or cathode (5) formed on the substrate (2); a luminescent layer (4) formed on the anode (3) or cathode (5); a cathode (5) or anode (3) formed on the luminescent layer (4); and a doped layer formed by doping cations (6) into between the luminescent layer (4) and cathode (5). Alternatively, a functional thin-film element comprise: a substrate (13); an anode (14) or cathode (16) formed on the substrate (13); a luminescent layer (15) formed on the anode (14) or cathode (16); a cathode (16) or anode (14) formed on the luminescent layer (15); and a doped layer formed by doping anions (17) into between the luminescent layer (15) and anode (14).

21 Claims, 10 Drawing Sheets

LUMINESCENCE

FIG. 9A
FIG. 9B
FIG. 9C
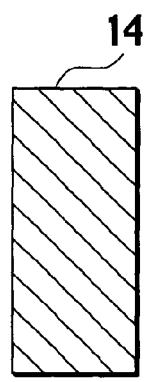
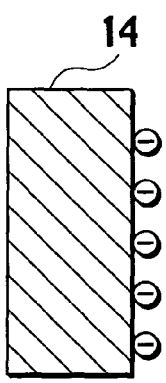
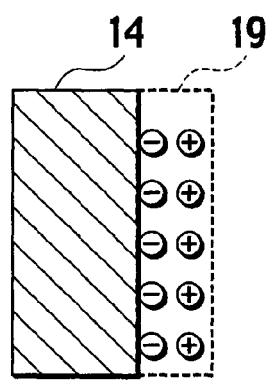
FIG. 9D
FIG. 9E
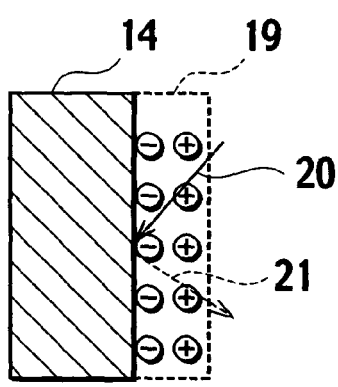
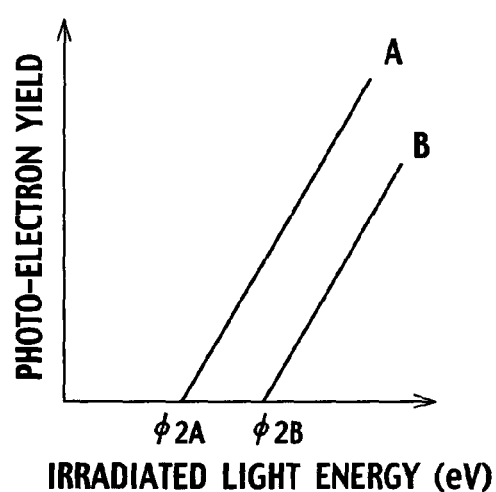

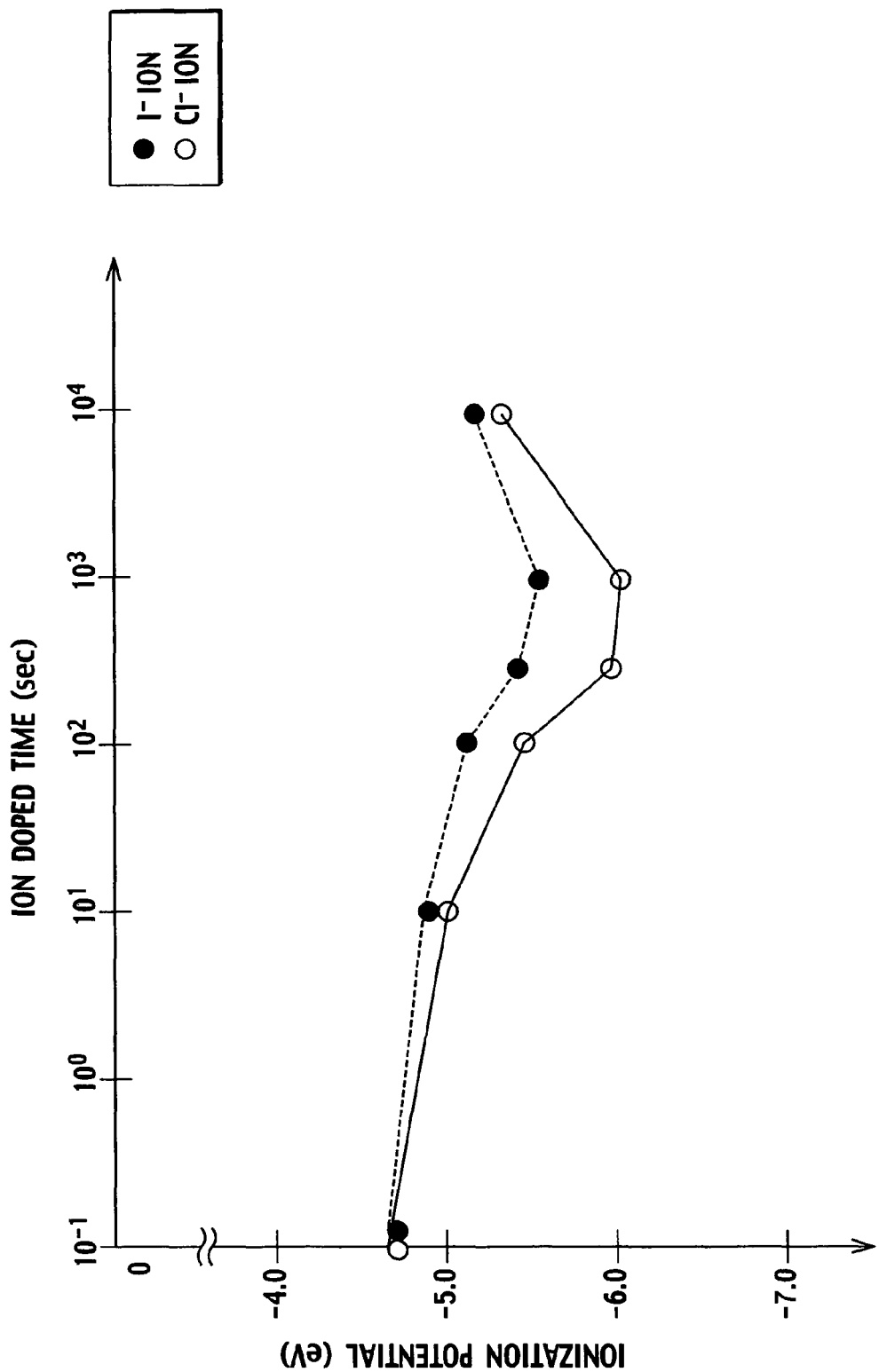

FUNCTIONAL THIN-FILM ELEMENT, PRODUCING METHOD THEREOF, AND ARTICLE USING FUNCTIONAL THIN-FILM ELEMENT

BACKGROUND OF THE INVENTION

1. Technical Field

The present invention relates to a functional thin-film element usable in an organic EL element (organic electroluminescence element), inorganic EL element, solar cell, light modulation element, transistor element (FET element), and the like, a producing method of a functional thin-film element, and an article using a functional thin-film element.

2. Relevant Art

Development of functional elements is being accelerated by virtue of the recent progress of IT (information technology). Examples of functional elements include: an electroluminescence element configured to emit light; a solar cell configured to absorb light and convert it into energy; a light modulation element (based on liquid crystal, electrochromic, and the like) having a light transmittance to be modulated by turning on and off a voltage across the light modulation element; and a transistor element (FET element). Recently, there have been extensively conducted researches on functional elements for televisions (TV) such as a plasma display having a merit of higher brightness and wider viewing angle, and an organic electroluminescence display, and there have been frequently used functional elements in a flat panel display for vehicular navigation systems, a cellular phone, and an electronic paper, in the fields other than TV's.

In such functional elements represented by solar cells and light modulation elements, there is/are interposed a functional thin film or films between an anode and a cathode, in a manner to actively utilize movement of charge carriers (electrons and positive holes) in interfaces between both electrodes and functional thin film, or in an interface between the functional thin films, i.e., in the junction interface(s), thereby exhibiting electronic and optical functions.

Further explanation will be concretely provided, taking a recently attention-getting organic electroluminescence element, for example. Japanese Patent Application Laid-Open Publication No. 11-251066 and The Organic EL Element Technique, Technotimes Publication Co., Ltd. (Page 17) disclose an organic EL element including a transparent substrate (glass, resin), an anode (transparent electrode: ITO (indium tin oxide)) formed thereon, and a luminescent layer (functional thin film) and a cathode (Mg/Ag) formed on the anode.

In an organic EL element, application of a voltage between an anode and a cathode causes positive holes from the anode side and electrons from the cathode side to be injected into a luminescent layer (functional thin film) by overcoming potential barriers $\Delta\phi$ at junction interfaces between the anode and cathode and the luminescent layer, respectively. Injected positive holes and electrons are recombined to emit light which is then emitted from the anode (transparent electrode) side. Supposing here that ITO as the anode (transparent electrode) has an ionization potential $\phi_2$ of about −4.5 eV to −4.7 eV and the luminescent layer has an ionization potential $\phi_H$ of about −5.4 eV to −5.8 eV, there is caused a potential barrier $\Delta\phi_A$ of as large as about −0.7 eV to −1.3 eV between the anode and the luminescent layer. Larger potential barriers make it necessary to increase application voltages between the anode and cathode to facilitate injection of positive holes from the anode into the luminescent layer so as to obtain an intended emission brightness, thereby making it difficult to drive organic EL elements at lower voltages. It is also difficult to attain a balance between positive holes and electrons to be injected from a cathode and an anode, respectively, thereby problematically failing to maintain stabilized light emission. Thus, the following three methods have been attempted.

The first method is to fix an ionization potential $\phi_2$ of an anode (transparent electrode: ITO), and to insert, between the anode and a luminescent layer, a buffer layer having an ionization potential at a level between those of ionization potentials $\phi_2$, $\phi_H$ of the anode and luminescent layer, respectively.

The second method is to fix an ionization potential $\phi_2$ of an anode (transparent electrode: ITO), and to select a luminescent layer having an ionization potential $\phi_H$ close to the ionization potential $\phi_2$ of the anode.

Contrary to the second method, the third method is to fix an ionization potential $\phi_H$ of a luminescent layer, and to select an anode having an ionization potential $\phi_2$ close to the ionization potential $\phi_H$ of the luminescent layer.

SUMMARY OF THE INVENTION

However, the following problems have been newly caused, even by adopting the above-mentioned methods.

In the first method, there is stepwise varied an energy difference between the anode and the luminescent layer by inserting the buffer layer therebetween, so that positive holes (holes) as carriers are easily injected into the luminescent layer by overcoming the potential barrier $\Delta\phi_A$, when viewed from the anode side. However, the buffer layer is to have an ionization potential $\phi$ which is not arbitrarily controlled, and there are required coating, curing, and other steps for forming the buffer layer, thereby leading to an increased number of steps of producing process and to a considerably increased cost, resulting in an impractical method.

In the second method, selection of a luminescent layer having an ionization potential $\phi_H$ relatively close to the ionization potential $\phi_2$ of the anode, fails to obtain an arbitrary luminescence color (wavelength) and to obtain a higher light emission efficiency.

In the third method, it has been extremely difficult to select an anode (transparent electrode: ITO) which meets required properties such as lower resistance, higher light transmittance, formability (such as etching ability) of electrode pattern, and surface flatness, and which has an ionization potential close to the ionization potential $\phi_H$ of the luminescent layer. Note that, in addition to ITO, examples of transparent electrodes include ATO (Antimony doped Tin Oxide), FTO (F doped Tin Oxide), ZnO (Zinc Oxide) and the like, and this is also true in this case.

Thus, previous methods have been required to adopt a due combination of metal, oxide semiconductor, and functional thin film as constituent elements of a functional thin-film element, based on ionization potentials as physical properties inherent in the constituent elements.

The present invention has been made in view of the foregoing points, and it is therefore an object of the present invention to provide a functional thin-film element for overcoming the above problems.

To achieve the object, according to an aspect of the invention, a functional thin-film element comprises: a substrate; a first electrode formed on the substrate; a functional thin film formed on the first electrode; a second electrode formed on the functional thin film, the second electrode having a different polarity to the first electrode; and a doped layer formed with an ionic dopant between the functional thin film and one of the first and second electrodes.

Preferably, the first electrode has a positive polarity as an anode or a negative polarity as a cathode, or alternatively, the second electrode has a positive polarity as an anode or a negative polarity as a cathode. Preferably, the ionic dopant comprises an anion or a cation.

To achieve the object described, according to another aspect of the invention, a producing method of a functional thin-film element comprises: providing a substrate; forming a first electrode on the substrate; forming a functional thin film on the first electrode; forming a second electrode on the functional thin film, the second electrode having a different polarity to the first electrode; and having a doped layer formed with an ionic dopant between the functional thin film and one of the first and second electrodes.

The forming the functional thin film and/or the forming the second electrode may preferably follow having the doped layer formed.

To achieve the object described, according to another aspect of the invention, an article, a photoelectromotive module, or a semiconductor module comprises a functional thin-film element according to any of the foregoing aspects.

BRIEF DESCRIPTION OF THE ACCOMPANYING DRAWINGS

The above and further objects, features, and advantages of the present invention will appear more fully from the detailed description of the preferred embodiments, when the same is read in conjunction with the accompanying drawings, in which.

Figure 1:
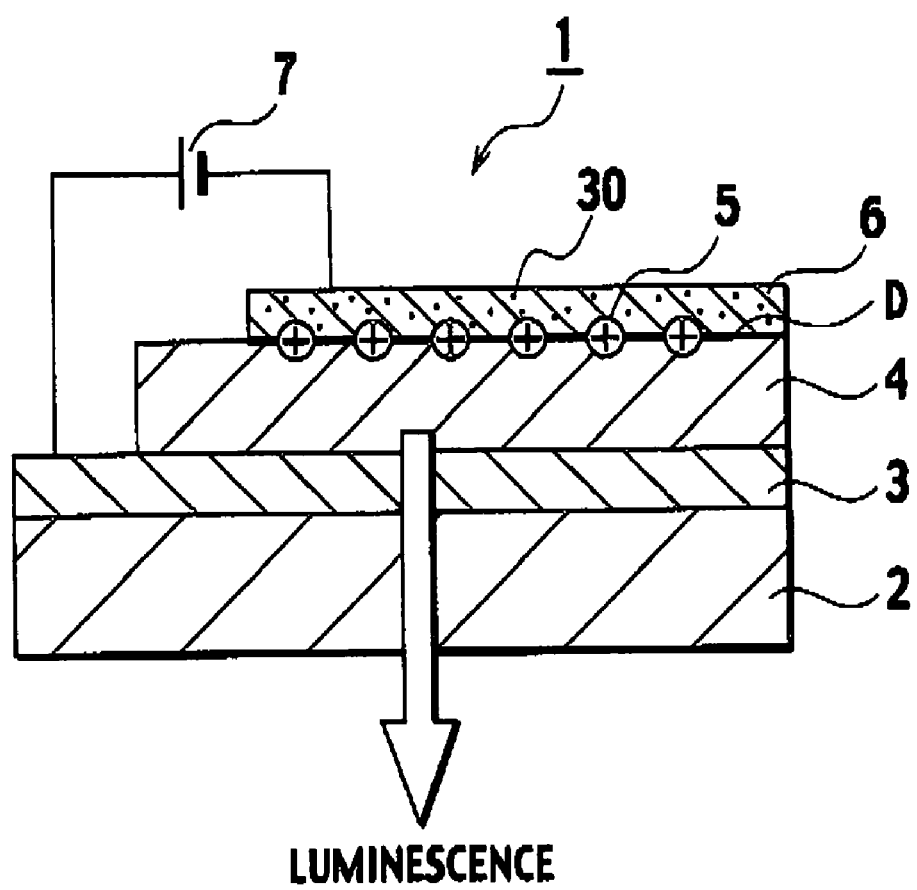
FIG. 1 is a cross-sectional view of an organic EL element as a functional thin-film element according to a first embodiment of the present invention.
Figure 3A:
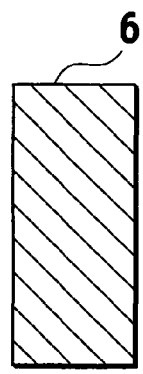
Figure 3B:
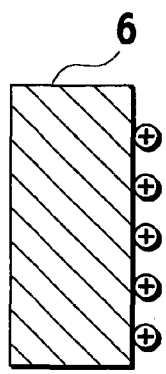
Figure 3C:
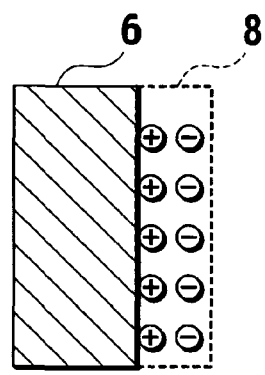
Figure 3D:
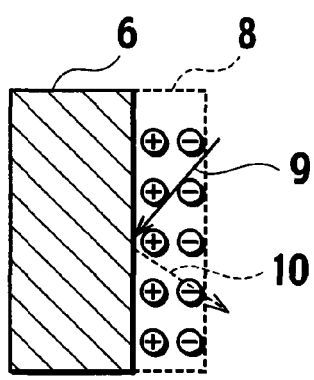
Figure 3E:
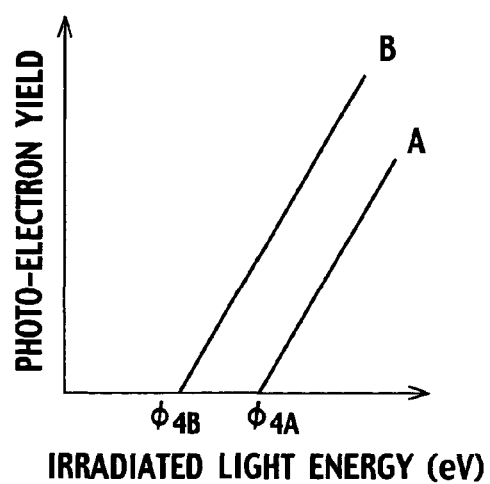
Figure 4:
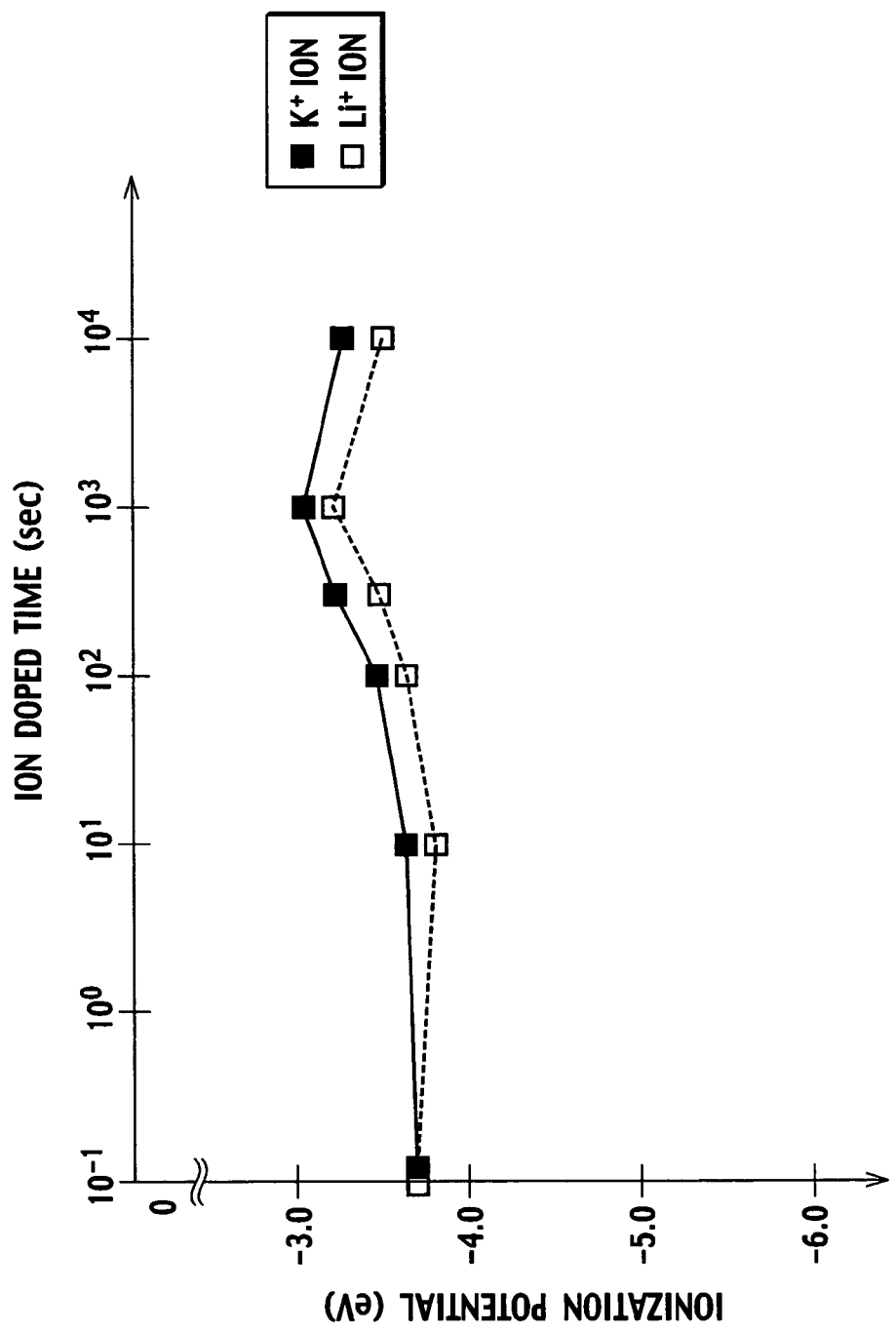
Figure 5:
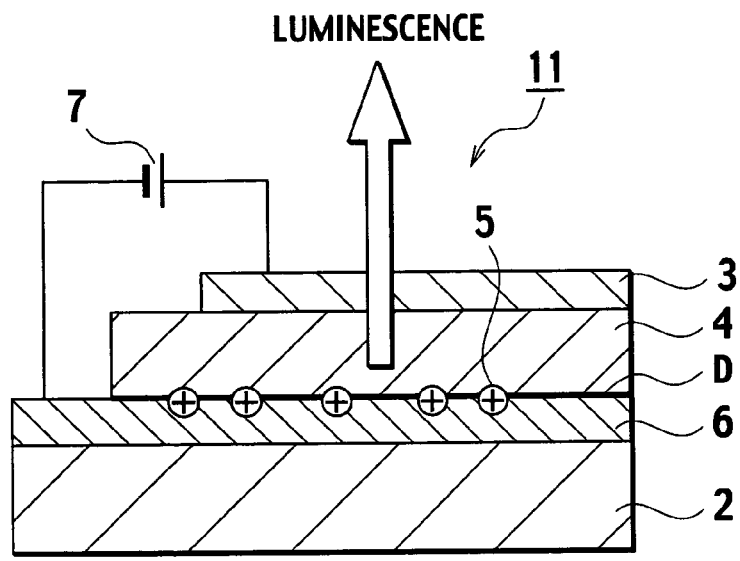
Figure 6:
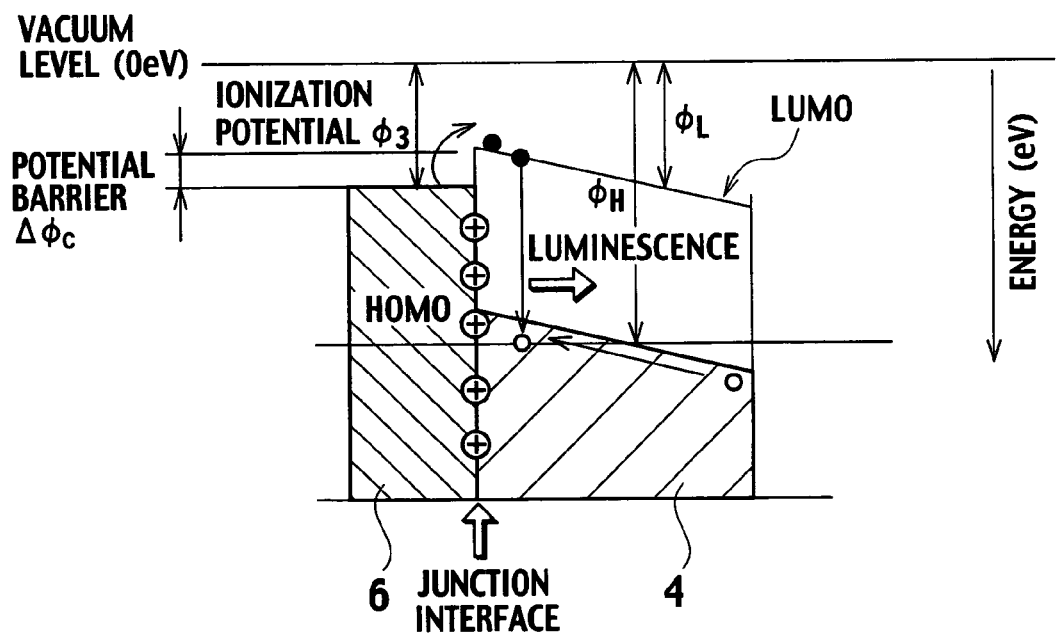
Figure 7:
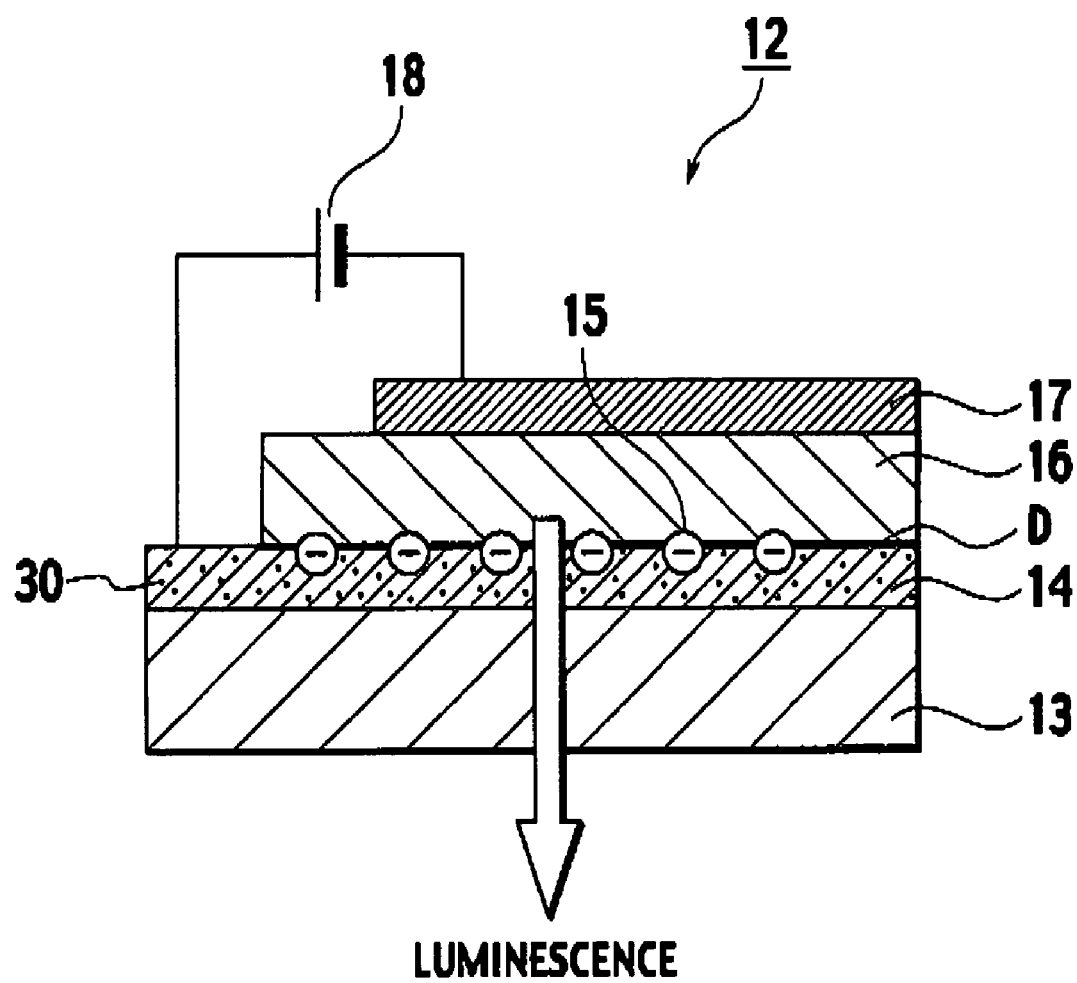
Figure 8:
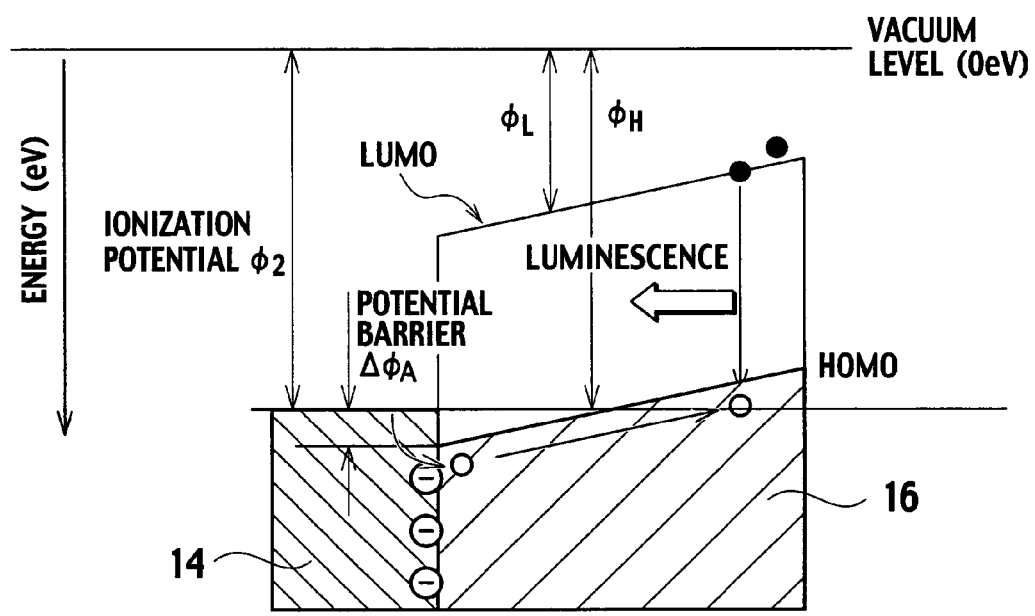
Figure 11:
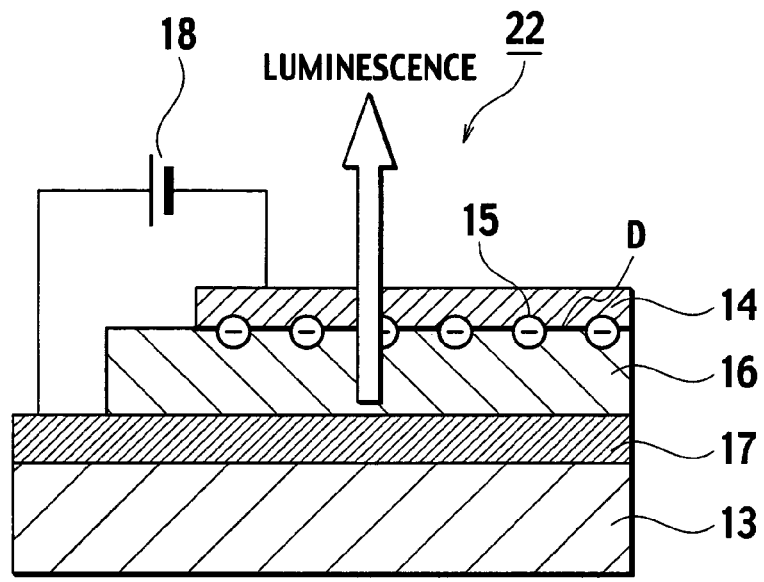
Figure 12:
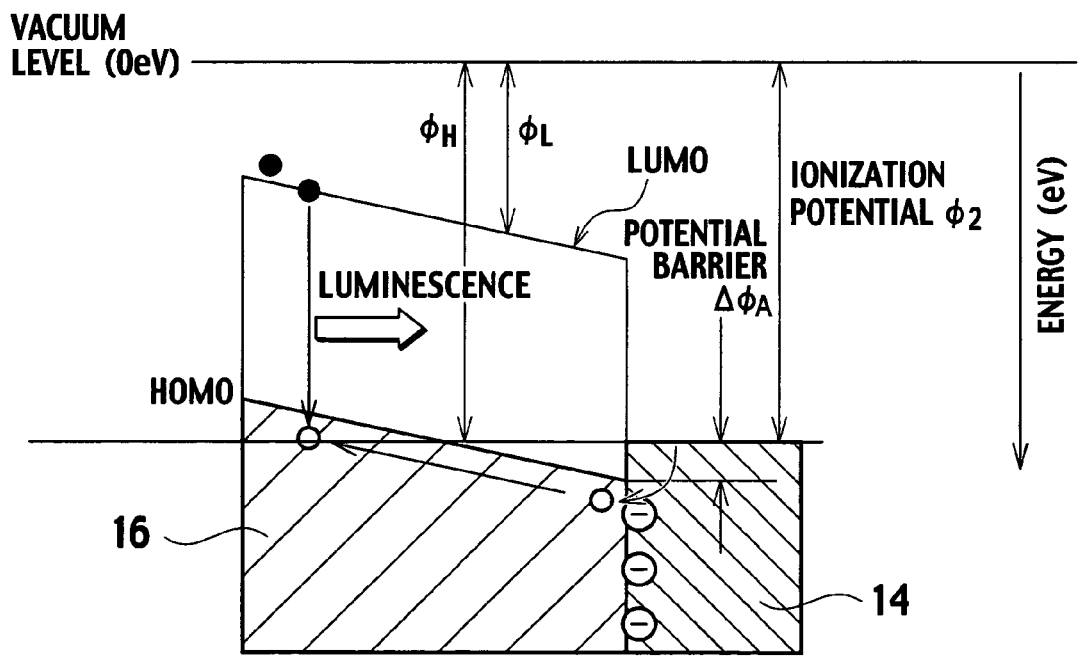

FIGS. 3A through 3E are explanatory views of a function of a cathode of the organic EL element of FIG. 1, wherein FIGS. 3A through 3C show stages for forming an electrical double layer by doping cations into a cathode surface, FIG. 3D shows a procedure for measuring an ionization potential of the cathode having the electrical double layer formed thereon, and FIG. 3E shows a measurement result thereof;

FIG. 4 is a graph illustrating a relationship between a cation doped period of time and an ionization potential of the cathode of FIG. 3A, for different cations;

FIG. 5 is a cross-sectional view of an organic EL element according to a modification of the first embodiment;

FIG. 6 is a schematic view of an energy band structure of the organic EL element of FIG. 5;

FIG. 7 is a cross-sectional view of an organic EL element as a functional thin-film element according to a second embodiment of the present invention;

FIG. 8 is a schematic view of an energy band structure of the organic EL element of FIG. 7;

FIGS. 9A through 9E are explanatory views of a function of an anode of the organic EL element of FIG. 7, wherein FIGS. 9A through 9C show stages for forming an electrical double layer by doping anions into an anode surface, FIG. 9D shows a procedure for measuring an ionization potential of the anode having the electrical double layer formed thereon, and FIG. 9E shows a measurement result thereof;

FIG. 10 is a graph illustrating a relationship between a cation doped period of time and an ionization potential of the anode of FIG. 9A, for different anions;

FIG. 11 is a cross-sectional view of an organic EL element according to a modification of the second embodiment; and FIG. 12 is a schematic view of an energy band structure of the organic EL element of FIG. 11.

DETAILED DESCRIPTION OF THE PREFERRED EMBODIMENTS

There will be explained configurations of functional thin-film elements and producing methods thereof according to preferred embodiments of the present invention, as well as articles adopting such functional thin-film elements, with reference to the accompanying drawings.

First Embodiment

FIG. 1 is a cross-sectional view of an organic EL element 1 as a functional thin-film element according to a first embodiment of the present invention. As shown in FIG. 1, the organic EL element 1 comprises a substrate 2 having light transmittivity, an anode 3 formed on the substrate 2 and having light transmittivity, a luminescent layer 4 formed on the anode 3 and acting as a functional thin film, a doped layer D formed by doping cations 5 on the luminescent layer 4, and a cathode 6 formed on the doped layer D. Connected to the anode 3 and cathode 6 is a power source 7. The cathode 6 can include electroconductive nanoparticles 30, as will be discussed herein. Note that the organic EL element 1 shown in FIG. 1 includes the doped layer D formed by doping cations 5 between the luminescent layer 4 and cathode 6, this may be achieved by doping cations 5 into a junction interface between the luminescent layer 4 and cathode 6, or by doping cations 5 into one of the surfaces of the luminescent layer 4 and cathode 6. The doped layer D formed by doping cations 5 between the luminescent layer 4 and cathode 6, allows a potential barrier therebetween to be arbitrarily controlled to facilitate electron emission from the surface of the cathode 6. In other words, the doped layer D formed by doping cations 5 between the luminescent layer 4 and cathode 6, decreases an ionization potential of a material constituting the cathode 6 (i.e., brings the ionization potential closer to a vacuum level) to thereby decrease a potential barrier $\Delta\phi_c$ at the junction interface between the luminescent layer 4 and cathode 6 when viewed from electrons as carriers, thereby enabling electrons to be easily injected from the cathode 6 into the luminescent layer 4.

Figure 2:
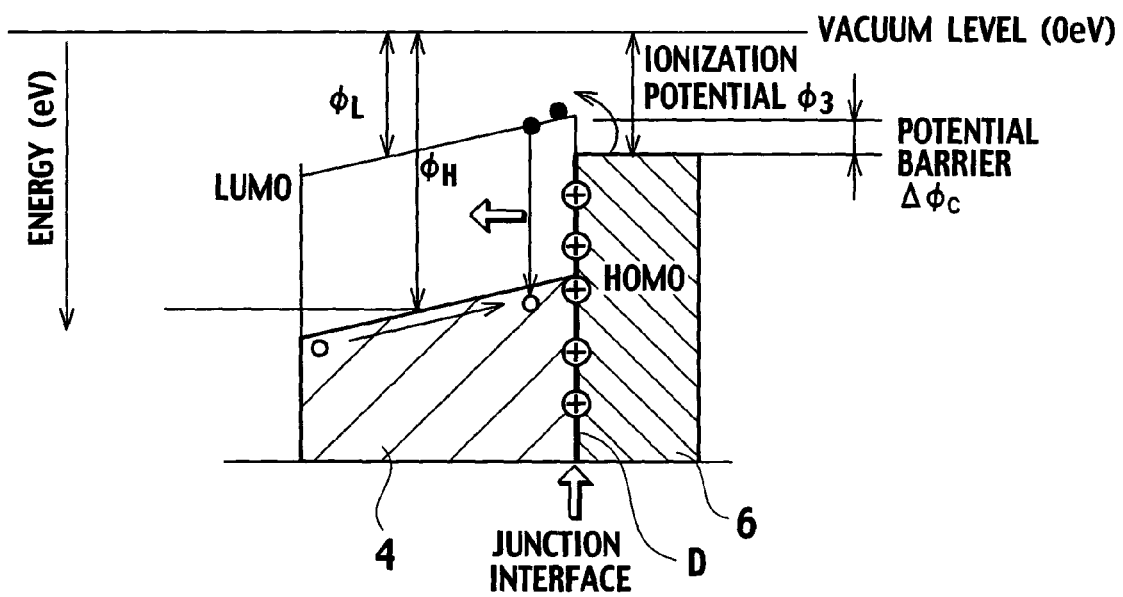
FIG. 2 is a schematic view of an energy band structure of the organic EL element of FIG. 1.

Concerning the organic EL element 1 having the above configuration, there will be concretely explained a band structure shown in FIG. 2, based on an example adopting PPV (polyphenylene vinylene) which is a typical organic luminescent layer as the luminescent layer 4, and a typical Mg/Ag electrode as the cathode 6.

FIG. 2 is a schematic view of the energy band structure. According to literatures, PPV has a HOMO (highest occupied molecular orbital) or ionization potential at a level $\phi_H$ of about −5.2 eV to −5.5 eV and a LUMO (lowest unoccupied molecular orbital) at a level $\phi_L$ of about −3.1 eV, and the Mg/Ag electrode as a cathode has an ionization potential $\phi_3$ of −3.7 eV. This theoretically leads to a potential barrier $\Delta\phi_C$ of about 0.6 eV at a junction interface between the luminescent layer 4 and cathode 6. In case of existence of a larger potential barrier at about 0.6 eV at the junction interface between the luminescent layer 4 and cathode 6, it is impossible to obtain a desired emission brightness unless an application voltage between the anode 3 and cathode 6 is increased. However, higher application voltages are impractical, because the same adversely affect stability of light emission, life duration of light emission, and the like. As such, cations 5 are doped into the junction interface between the luminescent layer 4 and cathode 6, thereby decreasing the ionization potential $\phi_3$ of the cathode 6. Although the mechanism by which the ionization potential $\phi_3$ of the cathode 6 is decreased, is not necessarily clear in the present state, it appears that such a mechanism can be explained based on a conceptional view shown in FIG. 3, from a result of study. Note that although the term "ionization potential" has been used for the quantity $\phi_3$ in case of the Mg/Ag electrode, it is rather appropriate to strictly call such a quantity a "work function" because the Mg/Ag electrode is metal. Nonetheless, the term "ionization potential" will be consistently used hereinafter, because the ionization potential has basically the same concept as the work function.

FIG. 3 shows a situation of the cathode 6 before and after cations are doped into the surface of the cathode 6, where a mark (−) represents anion and a mark (+) represents cation.

FIG. 3A shows the cathode 6 before doping of cations, and cations are formed over the surface of the cathode 6 (FIG. 3B) when cations are doped into the cathode 6. The cathode 6 is in an electrically unstable state, so that anions are induced which are negatively charged to keep electrical neutrality, thereby forming an electrical double layer 8 on the surface of the cathode 6 (FIG. 3C). It is presumed that electrons present within the cathode 6 are brought to be readily emitted from the surface of the cathode 6 to the outside, by virtue of anions present at the outermost surface of the cathode 6 based on the formation of the electrical double layer 8.

The ionization potential of the surface of the cathode 6 formed with the electrical double layer 8 can be measured by photoelectron spectroscopy (AC-2 of RIKEN KEIKI CO., LTD.), for example. As shown in FIG. 3D, as photo-electrons 10 flying out of the surface of the cathode 6 are measured by a counter while varying a wavelength (irradiated light energy) of monochromatic light 9 irradiated to the surface of the cathode 6, photo-electrons are suddenly emitted at a certain threshold value.

FIG. 3E is a graph of measurement results of ionization potential of the surface of the cathode 6, where a line A represents a measurement result for the cathode 6 before doping of cations, and a line B represents a measurement result for the cathode 6 formed with the electrical double layer after doping of cations. Note that the graph includes an abscissa representing an irradiated light energy (eV) and an ordinate representing a photo-electron yield, in which intersections between the line A and line B and the abscissa representing irradiated light energy represent ionization potentials, respectively ("ionization potential" is defined as an energy required to take an electron out of a neutral atom). As shown in FIG. 3E, it is presumed that the surface of the cathode 6 after cation doping has an ionization potential $\phi_{4B}$ which is decreased relative to the ionization potential $\phi_{4A}$ at the surface of the cathode 6 before cation doping, by virtue of effects of anions induced upon formation of the electrical double layer.

Note that "cation" means a positively charged ion, and known cations are utilizable, in a manner to desirably use a single kind of alkali metal element ion selected from a group consisting of $Li^+$, $Na^+$, $K^+$, $Rb^+$, and $Cs^+$, a single kind of alkaline earth metal element ion selected from a group consisting of $Be^{2+}$, $Mg^{2+}$, $Ca^{2+}$, $Sr^{2+}$, and $Ba^{2+}$, or a positive ionic complex including at least one of the cations noted just above. Doping such cation(s) enables the ionization potential $\phi_3$ of the cathode 6 to be varied. Namely, the ionization potential of the cathode 6 is decreased, with reference to a vacuum level shown in FIG. 2. The reasons thereof will be described hereinafter.

It is understood from a periodic table that electronegativities (each meaning an energy required for an atom to emit an electron therefrom which electron has been caught from an outside) of alkali metal elements (family Ia) and alkaline earth metals (family IIa), are smaller than those of other elements. Such smaller electronegativities are qualitative, and are also considered to be related to an energy (ionization potential) required for taking an electron out of a neutral atom. It is presumed that electrons are caused to be readily emitted from the cathode 6 to the outside by virtue of effects of electrons at the outermost surface of the cathode 6 formed with the electrical double layer, by causing the surface of the cathode 6 to be doped by cations of alkali metal elements or alkaline earth metal elements or by a positive ionic complex including at least one kind of such cations, each having a smaller electronegativity.

FIG. 4 is a graph showing a dependency of ionization potential on a processing time, when typical alkali metal element ions $Li^+$, $K^+$ are doped into a surface of a cathode 6 (Mg/Ag electrode). It is possible to find out two significant observations from FIG. 4.

The first observation is that both $Li^+$ and $K^+$ ions appear to have tendencies to exhibit minimum ionization potentials at certain doped times, respectively. This means that it is possible to arbitrarily control an ionization potential $\phi_3$ of the cathode 6 commensurately with an ionization potential $\phi_L$ of the luminescent layer 4.

The second observation is that the ionization potential is largely changed, in using $K^+$ than using $Li^+$. This suggests a possibility that ionization potentials $\phi$ are changed commensurately with an order of electronegativities, as noted above. It is thus concluded that ionization potentials $\phi$ can be largely and variably controlled by selecting cation(s) having smaller electronegativity (electronegativities) and by doping it/them into the surface of the cathode 6.

There will be explained a cathode material. The functional thin-film elements 1, 11 according to the embodiment of the present invention are each utilizable as a solar cell in addition to an organic EL element, and it is demanded in either case for a cathode 6 to have such properties including a lower ionization potential (lower work function), a lower surface resistance, an ability to readily form a circuit pattern, and an excellent stability. There is further demanded transparency of the cathode 6, for emission or incidence of light from or into the cathode 6 side. Although alloys (such as Mg/Ag, Al/Li, Mg/In) and Ca have been practically utilized from the above standpoint, the following serious defects are present. Namely, deposition is conducted by a physical vapor deposition method (such as vapor deposition method, sputtering method, ion plating method), thereby particularly causing a thermal damage in a luminescent layer (functional thin film). Further, deposition is conducted by a vacuum process, thereby leading to a lower deposition rate and an increased cost. This further leads to island like column structured thin films, thereby lacking a flexible property.

It is thus desirable to form a cathode from the following two kinds of materials. This enables: a flexible property of ITO to be ensured which has not been otherwise defectively ensured; and formation of a cathode layer even on an organic material having a lower heat resistance. Further, it becomes possible to increase a deposition rate to thereby attain a decreased cost, by utilizing a printing method or coating method as wet process. Moreover, doping of cations can be stabilized.

The first kind of material includes at least electroconductive nanoparticles and polymer resin, for forming a cathode therefrom. It is desirable that electroconductive nanoparticles are made of a single element selected from a group consisting of Au, Ag, Pt, Pd, Ni, Cu, Zn, Al, Sn, Pb, C, Ti, or made of a compound including one of the elements, and that particle diameters of electroconductive nanoparticles are about 50 nm or less. Particle diameters of electroconductive nanoparticles of 50 nm or less (which is about 1/10 or less of particle diameters) are smaller than a wavelength λ (380 to 780 nm) of incident light in a visible light range, thereby increasing light transmittance. Note that the term "particles" used herein are not limited to those spherical ones, and may include fibrous ones or needle-like ones such as carbon nanotube (CNT).

The second kind of material is a π-conjugated material for forming a cathode. Formation of a cathode from a π-conjugated material enables simultaneous establishment of a lower surface resistance and a higher light transmittance, by virtue of an action of π electrons in a conjugated double bond. Note that π-conjugated materials to be used herein are not limited to cathode materials, and may be used for one of cathode and functional thin film. It is further desirable that π-conjugated materials are polymer materials which are soluble in water or solvent. Formation of a cathode or functional thin film from such a polymer material makes it possible to continuously coat or print a cathode or functional thin film onto a flexible substrate by a full wet process. Further, it is desirable to form a cathode from a material obtained by a variously doped π-conjugated polymer, because of an eventually improved electroconductivity of the cathode.

Examples of polymer materials as the above-mentioned π-conjugated materials include at least one material selected from a group consisting of doped polypyrrole, doped polyaniline, doped polythiophene, doped polyacetylene, doped polyisothianaphtene, doped polyfuran, doped polyselenophene, doped polyselenophene, doped polytellurophene, doped polythiophene vinylene, doped polyparaphenylene vinylene, and derivatives of them. Selection of π-conjugated materials enables expression of desired functions such as chromophore, photoelectromotive force, while maintaining a lower resistance, and an excellent light transmittivity. It is further desirable that the polymer material comprises at least one kind selected from polyethylene dioxythiophene (PEDOT) and polypropylene oxide having a higher solubility, and derivatives thereof. Utilization of polymer materials having higher solubilities in water or solvent facilitates handling thereof such that the polymer materials can be coated and cured at desired film thicknesses by known various coating methods or printing methods, thereby enabling simplification of a production process. As a case using PEDOT, the polymer material may be a compound of polyethylene dioxythiophene (PEDOT) and polystyren sulfonate (PSS).

There will be explained a substrate. In case of extraction of light (luminescence) through the substrate 2 toward the outside of the organic EL element 1 as shown in FIG. 1, it is desirable that the substrate 2 has a higher averaged light transmittance within a visible light range. Higher light transmittances of the substrate 2 enable extremely decreased loss due to scattering and absorption of light. Although depending on thicknesses, surface smoothness, and the like of the substrate 2, the substrate 2 is to preferably have an averaged light transmittance of 80% or higher, preferably 85% or higher. Further, since there is required a flexible property of the organic EL element 1 in case of application thereof as a curved surface or a 3-dimensional shaped body, it is desirable to form the substrate 2 from a polymer resin film. Moreover, since anisotropy (birefringence Δn) of in-plane refractive index of a polymer resin film affects an emissive or incident direction of light, it is desirable to meet a condition of Δn≦0.1. This is because, birefringences Δn>0.1 lead to significant emission or incidence in a particular direction (angle), which is practically undesirable. Example materials of polymer resin films to be configured into a flexible substrate meeting a condition that a light transmittance is 80% and a birefringence Δn≦0.1, include at least one kind of material selected from a group consisting of polyethylene terephthalate (PET), polyethylene naphthalate (PEN), polycarbonate (PC), polymethyl methacrylate (PMMA), polyether sulphone (PES), and derivatives thereof. Formation of a substrate 2 from the above-mentioned polymer resin film allows light emitted from a luminescent layer 4 to be emitted to the outside through the substrate 2, and allows light from the outside of an organic EL element 1 to be introduced into the luminescent layer 4 through the substrate 2. Particularly, in case of utilization of a functional thin-film element according to the embodiment of the present invention as a solar cell, light incident from an outside of the functional thin-film element is allowed to be introduced into the functional thin film without optical loss due to existence of a substrate.

There will be explained a producing method of a functional thin-film element according to the embodiment of the present invention. There will be firstly explained a method for doping cations into a junction interface between a cathode and a functional thin film.

For cation doping, it is possible to appropriately select and use a known cation doping method. Examples of usable known doping methods include gaseous phase doping, liquid phase doping, electrochemical doping, and ion implantation. The gaseous phase doping is to generate ions to be doped such as by plasma under high vacuum, and to implant the generated ions into a cathode or functional thin film as a target material. The liquid phase doping is to dip a cathode in proton acid (such as $HNO_3$, $H_2SO_4$, HCl), and cations are doped into the cathode. The electrochemical doping is to dope $Li^+$ into a cathode, by using an electrolytic solution of $LiAsF_6$. The ion implantation is to accelerate ions to be doped by an electrolysis under high vacuum, thereby implanting the ions to a desired location of a cathode. Note that it is desirable, in doping cations, to take account of a target material in its type, layer thickness, and potential barrier to be set.

While the above-mentioned methods can be adopted as a cation doping method, it is particularly desirable to adopt the liquid phase doping or electrochemical doping. Namely, doping of cations is conducted after formation of a cathode by coating a cathode material comprising electroconductive nanoparticles and a light transmissive polymer resin, or a cathode material comprising a π-conjugated material, and by curing the cathode material. As such, the above noted method as a wet process is used for ion doping after formation of cathode by a preceding wet process, thereby enabling continuous production. Further, adoption of a wet process for subsequent formation of a functional thin film and an anode, enables a remarkably decreased cost. Contrary, the gaseous phase doping and the ion implantation require high vacuum as an environment for ion doping, thereby leading to extensive times for preparation and operation. Thus, it is not necessarily appropriate to adopt the gaseous phase doping or ion implantation, except for doping ions into a particular region of a finer or microstructured element. In view of the remarkable merits of the above suggested process, it is desirable to produce a functional thin-film element by the method to be described hereinafter.

Namely, the suggested producing method of a functional thin-film element includes: forming and curing a cathode on a substrate, from a cathode material comprising (i) π-conjugated polymer soluble in water or solvent, or (ii) electroconductive nanoparticles and light transmissive polymer resin, by a printing method; doping cations into a surface of the cathode; forming and curing a π-conjugated polymer as a functional thin film on the cathode including cations doped thereinto; and then forming and curing an anode of a π-conjugated polymer on the functional thin film by a printing method. It is alternatively possible to form an anode and a functional thin film on a substrate, and to thereafter dope cations into a surface of the functional thin film. Such a producing method of a functional thin film allows formation of a cathode on a substrate, cation doping, and formation of a functional thin film and an anode, in a continued manner by a wet method. It becomes resultingly possible to simplify a production process, to prolong a duration of life of a functional thin film by driving it at a lower voltage, to ensure a flexible property, and to attain a decreased cost. Particularly, adoption of a flexible resin film as a substrate enables a flexible functional thin-film element. Note that it is possible to adopt such a method for forming an anode on a substrate, subsequently forming a functional thin film and a cathode, and then doping cations into a junction interface between the functional thin film and the cathode.

While the organic EL element 1 shown in FIG. 1 has been described, the functional thin-film element according to the first embodiment of the present invention is not limited to the configuration shown in FIG. 1 and may have a configuration of an organic EL element shown in FIG. 5. Like reference numerals as used for the aforementioned organic EL element 1 shown in FIG. 1 are used to denote corresponding portions, to avoid their otherwise redundant description.

FIG. 5 shows an organic EL element 11 comprising: a substrate 2 having light transmittivity; a cathode 6 (Mg/Ag electrode) formed on the substrate 2; a doped layer D formed by doping cations 5 on the cathode 6: a luminescent layer 4 formed on the doped layer D; and an anode 3 formed on the luminescent layer 4 and having light transmittivity. Note that the organic EL element 11 shown in FIG. 5 includes the doped layer D formed by doping cations 5 between the luminescent layer 4 and cathode 6, this may be achieved by doping cations 5 into a junction interface between the luminescent layer 4 and cathode 6, or it is enough to dope cations 5 into one of a surface of the luminescent layer 4 and a surface of the cathode 6. Two situations are conceivable for a target layer, i.e., cations 5 may be doped into one of the luminescent layer 4 and cathode 6 as explained in FIG. 1. Thus, also in the organic EL element 11 shown in FIG. 5, it is possible to decrease a potential barrier at the junction interface between the luminescent layer 4 and cathode 6 as shown in FIG. 6, by doping cations 5 into the surface of the luminescent layer 4 or the surface of the cathode 6.

EXAMPLES

The present invention will be more concretely explained based on Examples, and the present invention is not limited to the Examples.

Example A-1

Formed on a polyethylene terephthalate (PET) film as a substrate was an Mg/Ag film as a cathode having a film thickness of 150 nm by a vacuum deposition method, to obtain a structural body comprising the substrate and the cathode thereon. The obtained structural body was introduced into a solution comprising ethyl alcohol containing $K^+$ ion, followed by dipping treatment for 500 seconds at a room temperature, thereby doping $K^+$ into a cathode surface.

Example A-2

Formed on a polyethylene terephthalate (PET) film as a substrate was an Mg/Ag film as a cathode having a film thickness of 150 nm by a vacuum deposition method, to obtain a structural body comprising the substrate and the cathode thereon. The obtained structural body was introduced into a solution comprising ethyl alcohol containing $Li^+$ ion, followed by dipping treatment for 500 seconds at a room temperature, thereby doping $Li^+$ into a cathode surface.

Example A-3

Formed on a polyethylene terephthalate (PET) film as a substrate was an Mg/Ag film as a cathode having a film thickness of 150 nm by a vacuum deposition method, to obtain a structural body comprising the substrate and the cathode thereon. $Li^+$ was electrochemically doped into a surface of the cathode of the obtained structural body, by using acetonitrile as an organic solvent, and $LiAsF_6$ as a supporting electrolyte. The doping as conducted at a room temperature.

Example A-4

Formed on a polyethylene terephthalate (PET) film as a substrate was a film as a cathode having a film thickness of 150 nm by coating a dispersion liquid containing 5 wt. % of electroconductive nanoparticles Au (50 nm) onto the polyethylene terephthalate film by a spin coater, to obtain a structural body comprising the substrate and the cathode thereon. The obtained structural body was introduced into a solution comprising ethyl alcohol containing $Li^+$, followed by dipping treatment for 500 seconds at a room temperature, thereby doping $Li^+$ into a cathode surface.

Example A-5

Formed on a polyethylene terephthalate (PET) film as a substrate was a film as a cathode having a film thickness of 150 nm by coating a dispersion liquid containing 5 wt. % of electroconductive nanoparticles Pt (50 nm) onto the polyethylene terephthalate film by a spin coater, to obtain a structural body comprising the substrate and the cathode thereon. The obtained structural body was introduced into a solution comprising ethyl alcohol containing $Li^+$, followed by dipping treatment for 500 seconds at a room temperature, thereby doping $Li^+$ into a cathode surface.

Example A-6

Formed on a polyethylene terephthalate (PET) film as a substrate was a film as a cathode having a film thickness of 150 nm by coating a dispersion liquid containing 5 wt. % of electroconductive nanoparticles CNT (diameter $\phi$ 10 nm+length L 100 nm) onto the polyethylene terephthalate film by a spin coater, to obtain a structural body comprising the substrate and the cathode thereon. The obtained structural body was introduced into a solution comprising ethyl alcohol containing $K^+$, followed by dipping treatment for 500 seconds at a room temperature, thereby doping $K^+$ into a cathode surface.

Example A-7

Formed on a polyethylene terephthalate (PET) film as a substrate was a film as a cathode having a film thickness of 150 nm by coating a dispersion liquid containing 5 wt. % of electroconductive nanoparticles CNT (diameter $\phi$ 10 nm×length L 100 nm) onto the polyethylene terephthalate film by a spin coater, to obtain a structural body comprising the substrate and the cathode thereon. The obtained structural body was introduced into a solution comprising ethyl alcohol containing Li$^+$, followed by dipping treatment for 500 seconds at a room temperature, thereby doping Li$^+$ into a cathode surface.

Example A-8

Formed on a polyethylene terephthalate (PET) film as a substrate was a doped polypyrrole film as a cathode having a film thickness of 150 nm by electrolytic polymerization. Polymerization was conducted for 500 seconds while adopting water as a solvent, and paratoluene sodium sulfonate (electrolyte concentration of 0.8 mol/l) as a supporting electrolyte, to obtain a structural body comprising the substrate and the cathode thereon. The obtained structural body was introduced into a solution comprising ethyl alcohol containing K$^+$, followed by dipping treatment for 500 seconds at a room temperature, thereby doping K$^+$ into a cathode surface.

Example A-9

Formed on a polyethylene terephthalate (PET) film as a substrate was a doped polypyrrole film as a cathode having a film thickness of 150 nm by electrolytic polymerization. Polymerization was conducted for 500 seconds while adopting pyrrole as a monomer, water as a solvent, and paratoluene sodium sulfonate (electrolyte concentration of 0.8 mol/l) as a supporting electrolyte, thereby forming a luminescent layer having a film thickness of 150 nm, to obtain a structural body comprising the substrate and the cathode and luminescent layer thereon. The obtained structural body was introduced into a solution comprising ethyl alcohol containing Li$^+$, followed by dipping treatment for 500 seconds at a room temperature, thereby doping Li$^+$ into a luminescent layer surface.

Example A-10

Formed on a polyethylene terephthalate (PET) film as a substrate was a film as a cathode having a film thickness of 150 nm by coating a composite liquid comprising polyethylene dioxythiophene (PEDOT)/polystyrene sulfonate (PSS) onto the polyethylene terephthalate film by a spin coater, to obtain a structural body comprising the substrate and the cathode thereon. The obtained structural body was introduced into a solution comprising ethyl alcohol containing K$^+$, followed by dipping treatment for 500 seconds at a room temperature, thereby doping K$^+$ into a cathode surface.

Example A-11

Formed on a polyethylene terephthalate (PET) film as a substrate was a film as a cathode having a film thickness of 150 nm by coating a composite liquid comprising polyethylene dioxythiophene (PEDOT)/polystyrene sulfonate (PSS) onto the polyethylene terephthalate film by a spin coater, to obtain a structural body comprising the substrate and the cathode thereon. The obtained structural body was introduced into a solution comprising ethyl alcohol containing Li$^+$, followed by dipping treatment for 500 seconds at a room temperature, thereby doping Li$^+$ into a cathode surface.

Example A-12

Formed on a polyethylene terephthalate (PET) film as a substrate was an ITO film as an anode having a film thickness of 150 nm by a sputtering method. Formed on the anode was a PPV layer as a luminescent layer having a film thickness of 100 nm by coating polyphenylene vinylene (PPV) onto the anode by a spin coater, to obtain a structural body comprising the substrate and the anode and luminescent layer thereon. The obtained structural body was introduced into a solution comprising ethyl alcohol containing K$^+$ ion, followed by dipping treatment for 500 seconds at a room temperature, thereby doping K$^+$ into a luminescent layer surface.

Example A-13

Formed on a polyethylene terephthalate (PET) film as a substrate was an ITO film as an anode having a film thickness of 150 nm by a sputtering method. Formed on the anode was a PPV layer as a luminescent layer having a film thickness of 100 nm by coating polyphenylene vinylene (PPV) onto the anode by a spin coater, to obtain a structural body comprising the substrate and the anode and luminescent layer thereon. The obtained structural body was introduced into a solution comprising ethyl alcohol containing Li$^+$ ion, followed by dipping treatment for 500 seconds at a room temperature, thereby doping Li$^+$ into a luminescent layer surface.

Example A-14

Formed on a polyethylene terephthalate (PET) film as a substrate was an ITO film as an anode having a film thickness of 150 nm by a sputtering method. Formed on the anode was a PPV layer as a luminescent layer having a film thickness of 100 nm by coating polyphenylene vinylene (PPV) onto the anode by a spin coater, to obtain a structural body comprising the substrate and the anode and luminescent layer thereon. Li$^+$ was electrochemically doped into a luminescent layer surface of the obtained structural body, while adopting acetonitrile as an organic solvent and LiAsF$_6$ as a supporting electrolyte. The doping was conducted at a room temperature.

Comparative Example A-1

Formed on a polyethylene terephthalate (PET) film as a substrate was an Mg/Ag film as a cathode having a film thickness of 150 nm by a vacuum deposition method, to obtain a structural body comprising the substrate and the cathode thereon. Unlike the above Examples, ion doping was not conducted in this Comparative Example A-1, and in the following Comparative Examples A-2 through A-7.

Comparative Example A-2

Formed on a polyethylene terephthalate (PET) film as a substrate was a film as a cathode having a film thickness of 150 nm by coating a dispersion liquid containing 5 wt. % of electroconductive nanoparticles Au (50 nm) onto the polyethylene terephthalate film by a spin coater, to obtain a structural body comprising the substrate and the cathode thereon.

Comparative Example A-3

Formed on a polyethylene terephthalate (PET) film as a substrate was a film as a cathode having a film thickness of 150 nm by coating a dispersion liquid containing 5 wt. % of electroconductive nanoparticles Pt (50 nm) onto the polyethylene terephthalate film by a spin coater, to obtain a structural body comprising the substrate and the cathode thereon.

Comparative Example A-4

Formed on a polyethylene terephthalate (PET) film as a substrate was a film as a cathode having a film thickness of 150 nm by coating a dispersion liquid containing 5 wt. % of electroconductive nanoparticles CNT (diameter $\phi$ 10 nm×length L 100 nm) onto the polyethylene terephthalate film by a spin coater, to obtain a structural body comprising the substrate and the cathode thereon.

Comparative Example A-5

Formed on a polyethylene terephthalate (PET) film as a substrate was a doped polypyrrole film as a cathode by electrolytic polymerization, thereby obtaining a structural body comprising the substrate and the cathode thereon. Polymerization was conducted for 500 seconds while adopting water as a solvent, and paratoluene sodium sulfonate (electrolyte concentration of 0.8 mol/l) as a supporting electrolyte.

Comparative Example A-6

Formed on a polyethylene terephthalate (PET) film as a substrate was a film as a cathode having a film thickness of 150 nm by coating a composite liquid comprising polyethylene dioxythiophene (PEDOT)/polystyrene sulfonate (PSS) onto the polyethylene terephthalate film by a spin coater, to obtain a structural body comprising the substrate and the cathode thereon.

Comparative Example A-7

Formed on a polyethylene terephthalate (PET) film as a substrate was an ITO film as an anode having a film thickness of 150 nm by a sputtering method. Formed on the anode was a PPV layer as a luminescent layer having a film thickness of 100 nm by coating polyphenylene vinylene (PPV) onto the anode by a spin coater, to obtain a structural body comprising the substrate and the anode and luminescent layer thereon.

Specimens obtained from the Examples and Comparative Examples were each placed in a desiccator followed by vacuuming for 24 hours, and each taken out of the desiccator into the atmosphere followed by ionization potential measurement by photoelectron spectroscopy (AC-2 of RIKEN KEIKI CO., LTD.). The measurement result is shown in Table 1.

TABLE 1

|  | Substrate | Cathode | Anode | Luminescent layer | Cation species to be doped | Doping method | Ionization potential (eV) |
| --- | --- | --- | --- | --- | --- | --- | --- |
| Ex. A-1 | PET*[1] | Mg/Ag | — | — | K+ | dipping | −3.2 |
| Ex. A-2 | PET*[1] | Mg/Ag | — | — | Li+ | dipping | −3.4 |
| Ex. A-3 | PET*[1] | Mg/Ag | — | — | Li+ | electro-chemical | −3.4 |
| Ex. A-4 | PET*[1] | Electroconductive nano-particle Au | — | — | Li+ | dipping | −3.9 |
| Ex. A-5 | PET*[1] | Electroconductive nano-particle Pt | — | — | Li+ | dipping | −4.0 |
| Ex. A-6 | PET*[1] | Electroconductive nano-particle CNT*[2] | — | — | K+ | dipping | −4.2 |
| Ex. A-7 | PET*[1] | Electroconductive nano-particle CNT*[2] | — | — | Li+ | dipping | −4.0 |
| Ex. A-8 | PET*[1] | Doped polypyrrole | — | — | K+ | electro-chemical | −4.4 |
| Ex. A-9 | PET*[1] | Doped polypyrrole | — | — | Li+ | electro-chemical | −4.6 |
| Ex. A-10 | PET*[1] | PEDOT*[3]/PSS*[4] | — | — | K+ | dipping | −4.1 |
| Ex. A-11 | PET*[1] | PEDOT*[3]/PSS*[4] | — | — | Li+ | dipping | −4.2 |
| Ex. A-12 | PET*[1] | — | ITO | PPV | K+ | dipping | −4.2 |
| Ex. A-13 | PET*[1] | — | ITO | PPV | Li+ | electro-chemical | −4.4 |
| Ex. A-14 | PET*[1] | — | ITO | PPV | Li+ | electro-chemical | −4.3 |
| Com. Ex. A-1 | PET*[1] | Mg/Ag | — | — | — | — | −3.7 |
| Com. Ex. A-2 | PET*[1] | Electroconductive nano-particle Au | — | — | — | — | −4.3 |
| Com. Ex. A-3 | PET*[1] | Electroconductive nano-particle Pt | — | — | — | — | −4.4 |
| Com. Ex. A-4 | PET*[1] | Electroconductive nano-particle CNT*[2] | — | — | — | — | −4.8 |
| Com. Ex. A-5 | PET*[1] | Doped polypyrrole | — | — | — | — | −5.0 |
| Com. Ex. A-6 | PET*[1] | PEDOT*[3]/PSS*[4] | — | — | — | — | −4.8 |
| Com. Ex. A-7 | PET*[1] | — | ITO | PPV | — | — | −5.2 |

*[1]Polyethylene Terephthalate
*[2]Carbon Nano Tube
*[3](Polyethylene dioxythiophene)/(Polystyrene sulfonate)
*[4]Polystyrene sulfonate As shown in Table 1, comparison of Examples with corresponding or countermeasure Comparative Examples clarifies that the Examples have higher ionization potentials (i.e., ionization potential closer to a vacuum level) than the corresponding Comparative Examples, respectively. As a result, it has become apparent that ionization potentials can be controlled so that functional thin-film elements can be driven by lower voltages, by doping cations into junction interfaces between cathodes and functional thin films, respectively.

Second Embodiment

FIG. 7 is a cross-sectional view of an organic EL element 12 according to a second embodiment of the present invention. As shown in FIG. 7, the organic EL element 12 comprises a substrate 13 having light transmittivity, an anode 14 formed on the substrate 13 and having light transmittivity, a doped layer D formed on the anode 14 by doping anions 15, a luminescent layer 16 formed on the doped layer D and acting as a functional thin film, and a cathode 17 formed on the luminescent layer 16. The anode 14 can include electro-conductive nanoparticles 30, as will be discussed herein. Connected to the anode 14 and the cathode 17 is a power source 18. Note that the organic EL element 12 shown in FIG. 7 includes a doped layer D formed by doping anions 15 between the anode 14 and luminescent layer 16, and this may be achieved by doping anions 15 into a junction interface between the anode 14 and luminescent layer 16, or by doping anions 15 into one of the surfaces of the anode 14 and luminescent layer 16.

The doped layer D formed by doping anions 15 between the anode 14 and luminescent layer 16, allows a potential barrier therebetween to be controlled to obstruct electron emission from the surface of the anode 14. In other words, the doped layer D formed by doping anions 15, increases an ionization potential of a material constituting the anode (i.e., brings the ionization potential away from a vacuum level) to thereby decrease a potential barrier $\Delta\phi_A$ at the doped layer D between the anode 14 and luminescent layer 16 when viewed from positive holes as carriers, thereby enabling positive holes to be easily injected from the anode 14 into the luminescent layer 16.

Concerning the organic EL element 12, having the above configuration, there will be concretely explained a band structure shown in FIG. 8, based on an example including a generally known ITO (indium tin oxide) transparent electrode as the anode 14, and PPV (polyphenylene vinylene) which is a typical organic luminescent layer as the luminescent layer 16.

FIG. 8 is a schematic view of the energy band structure. According to literatures, ITO has an ionization potential $\phi_2$ of about −4.5 eV to −4.7 eV, and PPV has a HOMO or ionization potential at a level $\phi_H$ of about −5.2 eV to −5.5 eV. This theoretically leads to a potential barrier $\Delta\phi_A$ of about 0.5 eV to 1.0 eV at a junction interface between the anode 14 and luminescent layer 16. In case of existence of a larger potential barrier at about 0.5 eV to 1.0 eV at the junction interface between the anode 14 and luminescent layer 16, it is impossible to obtain a desired emission brightness unless an application voltage between the anode 14 and cathode 16 is increased. However, higher application voltages lead to impractical levels, because the same adversely affect stability of light emission, life duration of light emission, and the like. As such, anions 17 are doped into the junction interface between the anode 14 and luminescent layer 16 so as to increase the ionization potential $\phi_2$ of the anode 14, thereby decreasing the potential barrier $\Delta\phi_A$ at the junction interface.

Although the mechanism by which the ionization potential $\phi_2$ of the anode 14 is increased, is not necessarily clear in the present state, it appears that such a mechanism can be explained based on a conceptional view shown in FIG. 9, from a result of study. Note that although the term "ionization potential" has been used for the quantity $\phi_2$ in case of ITO, it is rather appropriate to strictly call such a quantity a "work function" because ITO is inherently semiconductor (n-type). Nonetheless, the term "ionization potential" will be consistently used hereinafter, because the ionization potential has basically the same concept as the work function.

FIG. 9 shows a situation of the anode 14 before and after anions are doped into the surface of the anode 14, where a mark (−) represents anion and a mark (+) represents cation.

FIG. 9A shows the anode 14 before doping of anions, and anions are formed over the surface of the anode 14 (FIG. 9B) when anions are doped into the anode 14. The anode 14 is in an electrically unstable state, so that cations are induced which are positively charged to keep electrical neutrality, thereby forming an electrical double layer 19 on the surface of the anode 14 (FIG. 9C). It is presumed that electrons present within the anode 14 are blocked by the electrical double layer 19 formed in the above manner, and are thus brought to be hardly emitted from the surface of the anode 14 to the outside.

The ionization potential of the surface of the anode 14 formed with the electrical double layer 19 can be measured by photoelectron spectroscopy (AC-2 of RIKEN KEIKI CO., LTD.), for example. As shown in FIG. 9D, as photo-electrons 21 flying out of the surface of the anode 14 are measured by a counter while varying a wavelength (irradiated light energy) of monochromatic light 20 irradiated to the surface of the anode 14, photo-electrons are suddenly emitted at a certain threshold value.

FIG. 9E is a graph of measurement results of ionization potential of the surface of the anode 14, where a line A represents a measurement result for the anode 14 shown in FIG. 9A before doping of anions, and a line B represents a measurement result for the anode 14 shown in FIG. 9C formed with the electrical double layer 19 after doping of anions. Note that the graph includes an abscissa representing an irradiated light energy (eV) and an ordinate representing a photo-electron yield, in which intersections between the line A and line B and the abscissa representing irradiated light energy represent ionization potentials, respectively ("ionization potential" is defined as an energy required to take an electron out of a neutral atom). As a result, as understood from FIG. 9E, the ionization potential $\phi_{2B}$ of the anode 14 formed with the electrical double layer 19 by anion doping is as large as −5.3 eV whereas the ionization potential $\phi_{2A}$ of the surface of the untreated anode 14 is −4.7 eV, thereby proving that anion doping into the surface of the anode 14 increases the ionization potential $\phi_2$.

Note that "anion" means a negatively charged ion, and known anions are utilizable, in a manner to desirably use halogen element ions such as $F^-$, $Cl^-$, $Br^-$, $I^-$, Lewis acid ions such as $BF_4^-$, $PF_4^-$, $AsF_6^-$, $SbF_6^-$, proton acid ions such as $HNO^-$, $FeCl_3^-$, $MoCl_5^-$, $WCl_5^-$, $SnCl_4^-$, and organic metal halide ions such as $MoF_5^-$, $RuF_5^-$, $TaBr_5^-$, $SnI_4^-$. Among the noted anions, it is particularly desirable to use a single halogen element ion selected from $F^-$, $Cl^-$, $Br^-$, $I^-$, or a negative ionic complex including at least one kind of them. Examples of negative ionic complexes including at least one kind of single halogen element ion include Lewis acid ions such as $BF_4^-$, $PF_4^-$, $AsF_6^-$, $SbF_6^-$, and $HNO^-$, $FeCl_3^-$, $MoCl_5^-$, $WCl_5^-$, $SnCl_4^-$. Selection of the noted anions allows an ionization potential $\phi_2$ of an anode to be largely varied (be increased, with reference to a vacuum level), and the reason thereof is considered as follows at the present time.

It is understood from a periodic table that electronegativities (each meaning an energy required for an atom to emit an electron therefrom which electron has been caught from an outside) of halogen elements (family VIIb), are the largest among those of other elements in the corresponding periods, respectively. Although qualitative, larger electronegativities are considered to be related to an energy (ionization potential) required for taking an electron out of a neutral atom. It is thus presumed that, when anions of a halogen element having a larger electronegativity are doped into a surface of an anode, there is also formed a larger electrical double layer commensurately with the electronegativity, so that electron emission from a surface of the anode to the outside is obstructed.

FIG. 10 is a graph showing a dependency of ionization potential on a processing time, when $I^-$, $Cl^-$ ions are doped into an anode (ITO) surface. It is possible to find out two significant observations from FIG. 10.

The first observation is that both I⁻ and Cl⁻ ions appear to have tendencies to exhibit maximum ionization potentials at certain doped times, respectively. This means that it is possible to arbitrarily control an ionization potential $\phi_2$ of the anode 14 commensurately with an ionization potential $\phi_H$ of the luminescent layer 16.

The second observation is that the ionization potential is largely changed, in using Cl⁻ than using I⁻. This suggests a possibility that ionization potentials $\phi$ are changed commensurately with an order of electronegativities, as noted above. It is thus concluded that ionization potentials $\phi$ can be largely and variably controlled by selecting anion(s) having larger electronegativity (electronegativities) and by doping it/them into a surface of an anode.

There will be explained an anode material. Examples of anode materials desirably include (i) a material including at least electroconductive nanoparticles and a polymer resin, and (ii) a π-conjugated material, which have been described as cathode materials in the first embodiment, respectively. Note that although it is desirable to form an anode from a π-conjugated material, it is also desirable to form one of an anode and a functional thin film from a π-conjugated material, without limited to an anode.

As a substrate, it is desirable to select the same materials as those explained in the first embodiment, i.e., those materials having higher averaged light transmittances. There will be firstly explained a method for doping anions into a junction interface between an anode and a functional thin film, and it is possible to use the known method described in the first embodiment for doping cations into a junction interface between a cathode and a functional thin film. As such, the suggested producing method of a functional thin-film element includes: forming and curing π-conjugated polymer soluble in water or solvent into a pattern of an anode, by a printing method; doping anions into au upper surface of the anode at a junction interface between the anode and a functional thin film; and thereafter forming and curing π-conjugated polymer soluble in water or solvent into a functional thin film pattern onto the surface including the anions doped thereto, by a printing method. Such a producing method of a functional thin film allows formation of an anode on a substrate, anion doping, and formation of a functional thin film and a cathode, in a continued manner by a wet method. It becomes resultingly possible not only to attain low voltage driving and a prolonged life duration of a functional thin film, but also to ensure a flexible property and to attain a decreased cost. Particularly, adoption of a flexible resin film as a substrate enables a flexible functional thin-film element.

While the organic EL element 12 shown in FIG. 7 has been described, the functional thin-film element according to the second embodiment of the present invention is not limited to the configuration shown in FIG. 7 and may have a configuration of an organic EL element shown in FIG. 11. Like reference numerals as used for the aforementioned organic EL element 12 shown in FIG. 7 are used to denote corresponding portions, to avoid their otherwise redundant description.

FIG. 11 shows an organic EL element 22 comprising: a substrate 13 having light transmittivity; a cathode 17 made of Mg/Ag formed on the substrate 13; a luminescent layer 16 formed on the cathode 17; a doped layer D formed on the luminescent layer 16 by doping anions 15; and an anode 14 formed on the doped layer D and having light transmittivity. Note that the organic EL element 22 shown in FIG. 11 includes a doped layer D formed by doping anions 15 between the luminescent layer 16 and anode 14, this may be achieved by doping anions 17 into one of a surface of the anode 14 and a surface of the luminescent layer 16, or by doping anions 17 into a junction interface between the anodo 14 and luminescent layer 16. Two situations are conceivable for a target layer, i.e., anions 17 may be doped into one of the anode 14 and luminescent layer 16 as explained in FIG. 7. Thus, also in the organic EL element 22 shown in FIG. 11, it is possible to decrease a potential barrier at the doped layer D between the luminescent layer 16 and anode 14 as shown in FIG. 12, by doping anions 17 into the surface of the luminescent layer 16 or the surface of the anode 14.

EXAMPLES

The present invention will be more concretely explained based on Examples, and the present invention is not limited to the Examples.

Example B-1

Formed on a polyethylene terephthalate (PET) film as a substrate was a transparent electroconductive ITO film as an anode having a film thickness of 150 nm by a sputtering method, to obtain a structural body comprising the substrate and the anode thereon. The obtained structural body was introduced into a diluted $HNO_3$ solution containing Cl⁻, followed by dipping treatment for 500 seconds at a room temperature, thereby doping Cl⁻ into a surface of the anode.

Example B-2

Formed on a polyethylene terephthalate (PET) film as a substrate was a transparent electroconductive ITO film as an anode having a film thickness of 150 nm by a sputtering method, to obtain a structural body comprising the substrate and the anode thereon. The obtained structural body was introduced into a diluted $I_2$ solution containing I⁻, followed by dipping treatment for 500 seconds at a room temperature, thereby doping I⁻ into a surface of the anode.

Example B-3

Formed on a polyethylene terephthalate (PET) film as a substrate was a transparent electroconductive ITO film as an anode having a film thickness of 150 nm by a sputtering method, to obtain a structural body comprising the substrate and the anode thereon. The structural body was then treated by an electrochemical method at a room temperature by using acetonitrile as an organic solvent and $LiClO_4$ (anion Cl⁻) as a supporting electrolyte, thereby doping Cl⁻ into a surface of the anode.

Example B-4

Formed on a polyethylene terephthalate (PET) film as a substrate was an anode having a film thickness of 150 nm by coating a dispersion liquid containing 5 wt. % of electroconductive nanoparticles Au having a particle size of 50 nm onto the polyethylene terephthalate film by a spin coater. Thereafter, Cl⁻ was doped into a surface of the anode, by dipping the anode into a diluted $HNO_3$ solution containing Cl⁻ for 500 seconds at a room temperature.

Example B-5

Formed on a polyethylene terephthalate (PET) film as a substrate was an anode having a film thickness of 150 nm by coating a dispersion liquid containing 5 wt. % of electroconductive nanoparticles Pt having a particle size of 50 nm onto the polyethylene terephthalate film by a spin coater. Thereafter, Cl$^-$ was doped into a surface of the anode, by dipping the anode into a diluted HNO$_3$ solution containing Cl$^-$ for 500 seconds at a room temperature.

Example B-6

Formed on a polyethylene terephthalate (PET) film as a substrate was an anode having a film thickness of 150 nm by coating a dispersion liquid containing 5 wt. % of electroconductive nanoparticles CNT of diameter φ 10 nm×length L 100 nm onto the polyethylene terephthalate film by a spin coater. Thereafter, Cl$^-$ was doped into a surface of the anode, by dipping the anode into a diluted HNO$_3$ solution containing Cl$^-$ for 500 seconds at a room temperature.

Example B-7

Formed on a polyethylene terephthalate (PET) film as a substrate was an anode having a film thickness of 150 nm by coating a dispersion liquid containing 5 wt. % of electroconductive nanoparticles CNT of diameter φ 10 nm×length L 100 nm onto the polyethylene terephthalate film by a spin coater. Thereafter, I$^-$ was doped into a surface of the anode, by dipping the anode into a diluted I$_2$ solution containing I$^-$ for 500 seconds at a room temperature.

Example B-8

Formed on a polyethylene terephthalate (PET) film as a substrate was a doped polypyrrole film as an anode having a film thickness of 150 nm by electrolytic polymerization. Polymerization was conducted for 500 seconds while adopting water as a solvent, and paratoluene sodium sulfonate (electrolyte concentration of 0.8 mol/l) as a supporting electrolyte. Thereafter, Cl$^-$ was doped into a surface of the anode, by dipping the anode into a diluted HNO$_3$ solution containing Cl$^-$ for 500 seconds at a room temperature.

Example B-9

Formed on a polyethylene terephthalate (PET) film as a substrate was a doped polypyrrole film as an anode having a film thickness of 150 nm by electrolytic polymerization. Namely, polymerization was conducted for 500 seconds while adopting pyrrole as a monomer, water as a solvent, and paratoluene sodium sulfonate (electrolyte concentration of 0.8 mol/l) as a supporting electrolyte, thereby forming a transparent electroconductive layer having a film thickness of 150 nm. Thereafter, I$^-$ was doped into a surface of the anode, by dipping the anode into a diluted I$_2$ solution containing I$^-$ for 500 seconds at a room temperature.

Example B-10

Formed on a polyethylene terephthalate (PET) film as a substrate was a film as an anode having a film thickness of 150 nm by coating a composite liquid comprising polyethylene dioxythiophene (PEDOT)/polystyrene sulfonate (PSS) onto the polyethylene terephthalate film by a spin coater. Thereafter, Cl$^-$ was doped into a surface of the anode, by dipping the anode into a diluted HNO$_3$ solution containing Cl$^-$ for 500 seconds at a room temperature.

Example B-11

Formed on a polyethylene terephthalate (PET) film as a substrate was a film as an anode having a film thickness of 150 nm by coating a composite liquid comprising polyethylene dioxythiophene (PEDOT)/polystyrene sulfonate (PSS) onto the polyethylene terephthalate film by a spin coater. Thereafter, I$^-$ was doped into a surface of the anode, by dipping the anode into a diluted I$_2$ solution containing I$^-$ for 500 seconds at a room temperature.

Example B-12

Formed on a polyethylene terephthalate (PET) film as a substrate was a sputtered film made of Mg/Ag alloy as a cathode having a film thickness of 200 nm. Thereafter, formed on an upper surface of the cathode was a polyphenylene vinylene (PPV) film as a functional thin film having a film thickness of 100 nm by spin coating. Further, Cl$^-$ was doped into a surface of the functional thin film, by dipping the surface of the functional thin film into a diluted HNO$_3$ solution containing Cl$^-$ for 500 seconds at a room temperature.

Example B-13

Formed on a polyethylene terephthalate (PET) film as a substrate was a sputtered film made of Mg/Ag alloy as a cathode having a film thickness of 200 nm. Thereafter, formed on an upper surface of the cathode was a polyphenylene vinylene (PPV) film as a functional thin film having a film thickness of 100 nm by spin coating. Further, Cl$^-$ was electrochemically doped into a surface of the functional thin film, by using acetonitrile as an organic solvent, and LiClO$_4$ (anion Cl$^-$) as a supporting electrolyte, at a room temperature.

Example B-14

Formed on a polyethylene terephthalate (PET) film as a substrate was a sputtered film made of Mg/Ag alloy as an anode having a film thickness of 200 nm. Thereafter, formed on an upper surface of the anion was a polyphenylene vinylene (PPV) film as a functional thin film having a film thickness of 100 nm by spin coating. Thereafter, I$^-$ was doped into the surface of the functional thin film by dipping treatment for 500 seconds in the same manner as Example B-2, by using a solution (diluted I$_2$ solution, room temperature) containing I$^-$.

Comparative Example B-1

Formed on a polyethylene terephthalate (PET) film as a substrate was a transparent electroconductive ITO film as an anode having a film thickness of 100 nm by a sputtering method. This was provided as a standard specimen which was not ion doped.

Comparative Example B-2

Formed on a polyethylene terephthalate (PET) film as a substrate was an anode having a film thickness of 150 nm by coating a dispersion liquid containing 5 wt. % of electroconductive nanoparticles (Au) having a particle size of 50 nm onto the polyethylene terephthalate film by a spin coater.

Comparative Example B-3

Formed on a polyethylene terephthalate (PET) film as a substrate was an anode having a film thickness of 150 nm by coating a dispersion liquid containing 5 wt. % of electroconductive nanoparticles (Pt) having a particle size of 50 nm onto the polyethylene terephthalate film by a spin coater.

Comparative Example B-4

Formed on a polyethylene terephthalate (PET) film as a substrate was an anode having a film thickness of 150 nm by coating a dispersion liquid containing 5 wt. % of electroconductive nanoparticles CNT (diameter φ 10 nm×length L 100 nm) onto the polyethylene terephthalate film by a spin coater.

Comparative Example B-5

Formed on a polyethylene terephthalate (PET) film as a substrate was a doped polypyrrole film as an anode having a film thickness of 150 nm by electrolytic polymerization. Polymerization was conducted for 500 seconds while adopting water as a solvent, and paratoluene sodium sulfonate (electrolyte concentration of 0.8 mol/l) as a supporting electrolyte.

Comparative Example B-6

Formed on a polyethylene terephthalate (PET) film as a substrate was a film as an anode having a film thickness of 150 nm by coating a composite liquid comprising polyethylene dioxythiophene (PEDOT)/polystyrene sulfonate (PSS) onto the polyethylene terephthalate film by a spin coater.

Specimens obtained from the Examples B-1 through B-14 and Comparative Examples B-1 through B6 were each placed in a desiccator followed by vacuuming for 24 hours, and each taken out of the desiccator into the atmosphere followed by ionization potential measurement by photoelectron spectroscopy (AC-2 of RIKEN KEIKI CO., LTD.). The measurement result is shown in Table 2.

As shown in Table 2, Comparative Examples were not doped with anions and thus had higher ionization potentials (i.e., ionization potential closer to a vacuum level) than the corresponding or countermeasure Comparative Examples, respectively.

While the functional thin-film elements according to the embodiments and variations thereof of the present invention are utilizable in a displaying item (display), illuminating item, photoelectromotive module, solar cell module, and semiconductor module, it is desirable to utilize the functional thin-film elements as organic EL elements, organic solar cells, or organic laser.

Particularly, the organic EL elements 1, 12 shown in FIGS. 1, 7, which include the transparent substrates 2, 13 formed with the anodes 3, 14, respectively, can be each utilized as a displaying item, since light emission is directed toward and through the transparent substrate 2, 13 side.

Further, the organic EL elements 11, 22 shown in FIGS. 5, 11, which include the substrates 2, 13 formed with the cathodes 5, 16, respectively, can be each utilized as a laser or a light emitting element, since light emission is directed toward and through the anode 3, 14 side opposite to the substrate 2, 13.

It will be seen that, according to any one of the embodiments described, a functional thin-film element comprises: a substrate; an anode formed on the substrate; a functional thin film formed on the anode; a cathode formed on the functional thin film; and a doped layer formed by doping cations or anions into between the cathode and the functional thin film or into between the anode and the functional thin film. Or, a functional thin-film element comprises: a substrate; a cathode

TABLE 2

| | Substrate | Anode | Functional thin film (luminescent layer) | Anion species to be doped | Doping method | Ionization potential (eV) |
|---|---|---|---|---|---|---|
| Ex. B-1 | PET[1] | ITO[2] | — | Cl$^-$ | dipping | −5.2 |
| Ex. B-2 | PET[1] | ITO[2] | — | I$^-$ | dipping | −5.0 |
| Ex. B-3 | PET[1] | ITO[2] | — | Cl$^-$ | electro-chemical | −5.3 |
| Ex. B-4 | PET[1] | Electroconductive nano-particle Au | — | Cl$^-$ | dipping | −4.5 |
| Ex. B-5 | PET[1] | Electroconductive nano-particle Pt | — | Cl$^-$ | dipping | −4.5 |
| Ex. B-6 | PET[1] | Electroconductive nano-particle CNT[3] | — | Cl$^-$ | dipping | −5.1 |
| Ex. B-7 | PET[1] | Electroconductive nano-particle CNT[3] | — | I$^-$ | dipping | −4.9 |
| Ex. B-8 | PET[1] | Doped polypyrrole | — | Cl$^-$ | electro-chemical | −5.3 |
| Ex. B-9 | PET[1] | Doped polypyrrole | — | I$^-$ | electro-chemical | −5.1 |
| Ex. B-10 | PET[1] | PEDOT[4]/PSS[5] | — | Cl$^-$ | dipping | −5.5 |
| Ex. B-11 | PET[1] | PEDOT[4]/PSS[5] | — | I$^-$ | dipping | −5.2 |
| Ex. B-12 | PET[1] | — | PPV[6] | Cl$^-$ | dipping | −5.1 |
| Ex. B-13 | PET[1] | — | PPV[6] | Cl$^-$ | electro-chemical | −5.3 |
| Ex. B-14 | PET[1] | — | PPV[6] | I$^-$ | dipping | −5.0 |
| Com. Ex. B-1 | PET[1] | ITO[2] | — | — | — | −4.7 |
| Com. Ex. B-2 | PET[1] | Electroconductive nano-particle Au | — | — | — | −4.3 |
| Com. Ex. B-3 | PET[1] | Electroconductive nano-particle Pt | — | — | — | −4.4 |
| Com. Ex. B-4 | PET[1] | Electroconductive nano-particle CNT[3] | — | — | — | −4.8 |
| Com. Ex. B-5 | PET[1] | Doped polypyrrole | — | — | — | −5.0 |
| Com. Ex. B-6 | PET[1] | PEDOT[3]/PSS[4] | — | — | — | −4.8 |

[1] Polyethylene Terephthalate
[2] Indium Tin Oxide
[3] Carbon Nano Tube
[4] Polyethylene dioxythiophene
[5] Polystyrene sulfonate
[6] Polyphenylene Vinylene formed on the substrate; a functional thin film formed on the cathode; an anode formed on the functional thin film; and a doped layer formed by doping anions or cations into between the anode and the functional thin film or into between the cathode and the functional thin film.

The doped layer formed between the cathode and the functional thin film includes cations doped therein.

The doped layer formed between the cathode and the functional thin film includes anions doped therein.

The cations include a single kind of alkali metal element ion selected from a group consisting of $Li^+$, $Na^+$, $K^+$, $Rb^+$, and $Cs^+$, a single kind of alkaline earth metal element ion selected from a group consisting of $Be^{2+}$, $Mg^{2+}$, $Ca^{2+}$, $Sr^{2+}$, and $Ba^{2+}$, or a positive ionic complex including at least one of the cations.

The anions include a single kind of halogen element ion selected from a group consisting of $F^-$, $Cl^-$, $Br^-$, and $I^-$, or a negative ionic complex including at least one of the anions.

At least one of the cathode and anode is formed of electroconductive nanoparticles and a polymer resin having light transmittivity.

At least one of the cathode, anode, and functional thin film is formed of a π-conjugated material.

At least one of the cathode, anode, and functional thin film is formed of a π-conjugated material, and the π-conjugated material comprises a polymer material soluble in water or solvent.

At least one of the cathode, anode, and functional thin film is formed of a π-conjugated material, and the π-conjugated material is a polymer material soluble in water or solvent, the polymer material including at least one material selected from a group consisting of doped polypyrrole, doped polyaniline, doped polythiophene, doped polyacetylene, doped polyisothianaphtene, and derivatives of them.

At least one of the cathode, anode, and functional thin film is formed of a π-conjugated material, and the π-conjugated material is a polymer material soluble in water or solvent, the polymer material including at least one material selected from a group consisting of polyethylene dioxythiophene, polypropylene oxide, and derivatives thereof.

The substrate is formed of a polymer resin film having an averaged light transmittance of 80% or higher within a visible light range.

The substrate is formed of a polymer resin film having an averaged light transmittance of 80% or higher within a visible light range, and $\Delta n \leqq 0.1$ where $\Delta n$ is an in-plane birefringence of the polymer resin film.

The substrate is formed of a polymer resin film having an averaged light transmittance of 80% or higher within a visible light range, and the polymer resin includes at least one kind of resin selected from a group consisting of polyethylene terephthalate, polyethylene naphthalate, polycarbonate, polymethyl methacrylate, polyether sulphone, and derivatives thereof.

Further, a producing method of a functional thin-film element comprises: forming an anode made of a polymer material soluble in water or solvent, on a substrate by printing; forming a functional thin film made of a π-conjugated polymer, on the anode; doping cations into a surface of the functional thin film; and forming a cathode made of a π-conjugated polymer by printing, on the functional thin film including cations doped thereto. A producing method of a functional thin-film element comprises: forming a cathode made of a polymer material soluble in water or solvent, on a substrate by printing; doping cations into a surface of the cathode; forming a functional thin film made of a π-conjugated polymer, on the cathode including cations doped thereto; and forming an anode made of a π-conjugated polymer by printing, on the functional thin film. A producing method of a functional thin-film element comprises: forming an anode made of a polymer material soluble in water or solvent, on a substrate by printing; doping anions into a surface of the anode; forming a functional thin film made of a π-conjugated polymer, on the anode including anions doped thereto; and forming a cathode made of a π-conjugated polymer by printing, on the functional thin film. Or, a producing method of a functional thin-film element comprises: forming a cathode made of a polymer material soluble in water or solvent, on a substrate by printing; forming a functional thin film made of a π-conjugated polymer, on the cathode; doping anions into a surface of the functional thin film; and forming an anode made of a π-conjugated polymer by printing, on the functional thin film including anions doped thereto.

The polymer material soluble in water or solvent is: a material including electroconductive nanoparticles, and a polymer resin having light transmittivity; or a π-conjugated polymer.

The contents of Japanese Patent Application Nos. 2004-253226 and 2004-253239, both filed to the Japanese Patent Office on Aug. 31, 2004, are incorporated herein by reference.

Although the present invention has been described based on the embodiments, the present invention is not limited thereto, and various modifications may be made thereto without departing from the spirit or scope of the present invention.

What is claimed is:

1. A functional thin-film element comprising:
   a substrate;
   a first electrode formed on the substrate;
   a functional thin film formed on the first electrode; and
   a second electrode formed on the functional thin film, the second electrode having a different polarity to the first electrode;
   wherein the functional thin film meets one of the first and second electrodes, and an ionic dopant is located at a junction interface between the functional thin film and one of the first and second electrodes.

2. The functional thin-film element as claimed in claim 1, wherein the first electrode comprises an anode, and the second electrode comprises a cathode.

3. The functional thin-film element as claimed in claim 1, wherein the first electrode comprises a cathode, and the second electrode comprises an anode.

4. The functional thin-film element as claimed in claim 1, wherein said one of the first and second electrodes has a positive polarity, and the ionic dopant comprises an anion.

5. The functional thin-film element as claimed in claim 1, wherein said one of the first and second electrodes has a negative polarity, and the ionic dopant comprises a cation.

6. The functional thin-film element as claimed in claim 1, wherein the ionic dopant comprises one of a cation and a positive ionic complex that comprises one of an alkali metal element ion selected from the group consisting of $Li^+$, $Na^+$, $K^+$, $Rb^+$, and $Cs^+$, and an alkaline earth metal element ion selected from the group consisting of $Be^{2+}$, $Mg^{2+}$, $Ca^{2+}$, $Sr^{2+}$, and $Ba^{2+}$.

7. The functional thin-film element as claimed in claim 1, wherein the ionic dopant comprises one of an anion and a negative ionic complex that comprises a halogen element ion selected from the group consisting of $F^-$, $Cl^-$, $Br^-$, and $I^-$.

8. The functional thin-film element as claimed in claim 1, wherein said one of the first and second electrodes comprises electroconductive nanoparticles, and a transparent polymer resin.

9. The functional thin-film element as claimed in claim 1, wherein one of the first electrode, the functional thin film, and the second electrode comprises a π-conjugated material.

10. The functional thin-film element as claimed in claim 9, wherein the π-conjugated material comprises a polymer material soluble in water or solvent.

11. The functional thin-film element as claimed in claim 9, wherein the π-conjugated material comprises a polymer material soluble in water or solvent, the polymer material including at least one material selected from the group consisting of doped polypyrrole, doped polyaniline, doped polythiophene, doped polyacetylene, doped polyisothianaphtene, and derivatives of them.

12. The functional thin-film element as claimed in claim 9, wherein the π-conjugated material comprises a polymer material soluble in water or solvent, the polymer material including at least one material selected from the group consisting of polyethylene dioxythiophene, polypropylene oxide, and derivatives thereof.

13. The functional thin-film element as claimed in claim 1, wherein the substrate comprises a polymer resin film having an average light transmittance of 80% or higher within a visible light range.

14. The functional thin-film element as claimed in claim 13, wherein the polymer resin film has an in-plane birefringence of 0.1 or less.

15. The functional thin-film element as claimed in claim 13, wherein the polymer resin includes at least one kind of resin selected from the group consisting of polyethylene terephthalate, polyethylene naphthalate, polycarbonate, polymethyl methacrylate, polyether sulphone, and derivatives thereof.

16. An article comprising a functional thin-film element according to claim 1.

17. The article as claimed in claim 16, comprising a display or an illuminator comprising the functional thin-film element.

18. A photoelectromotive module comprising a functional thin-film element according to claim 1.

19. A semiconductor module comprising a functional thin-film element according to claim 1.

20. A functional thin film element comprising:
a substrate;
an anode formed on the substrate;
a luminescent layer formed on the anode; and
a cathode formed on the luminescent layer;
wherein the luminescent layer meets the anode, and an anionic dopant is located at a junction interface between the luminescent layer and the anode, wherein the anionic dopant comprises a halogen element ion selected from the group consisting of $F^-$, $Cl^-$, $Br^-$, and $I^-$.

21. A functional thin film element comprising:
a substrate;
a cathode formed on the substrate;
a luminescent layer formed on the cathode; and
an anode formed on the luminescent layer;
wherein the luminescent layer meets the anode, and an anionic dopant is located at a junction interface between the luminescent layer and the anode, wherein the anionic dopant anion comprises a halogen element ion selected from the group consisting of $F^-$, $Cl^-$, $Br^-$, and $I^-$.

* * * * *